(12) United States Patent
Ishikawa et al.

(10) Patent No.: US 6,657,318 B2
(45) Date of Patent: Dec. 2, 2003

(54) SEMICONDUCTOR INTEGRATED CIRCUIT DEVICE AND METHOD FOR MOUNTING CIRCUIT BLOCKS IN SEMICONDUCTOR INTEGRATED CIRCUIT DEVICE

(75) Inventors: Yasuyuki Ishikawa, Kariya (JP); Kouji Ichikawa, Kariya (JP)

(73) Assignee: Denso Corporation, Kariya (JP)

( * ) Notice: Subject to any disclaimer, the term of this patent is extended or adjusted under 35 U.S.C. 154(b) by 67 days.

(21) Appl. No.: 09/911,577

(22) Filed: Jul. 25, 2001

(65) Prior Publication Data
US 2002/0014915 A1 Feb. 7, 2002

(30) Foreign Application Priority Data
Jul. 26, 2000 (JP) ............................ 2000-225584

(51) Int. Cl.$^7$ .................................................. H02J 1/00
(52) U.S. Cl. ........................ 307/30; 307/147; 257/202; 257/503; 257/909; 327/565
(58) Field of Search ................. 307/30, 147; 257/202, 257/503, 909; 327/565

(56) References Cited

U.S. PATENT DOCUMENTS 5,027,089 A * 6/1991 Henke ........................ 333/12
5,404,265 A * 4/1995 Moresco et al. ......... 361/306.1
5,844,762 A * 12/1998 Yamamura et al. ......... 361/111
6,054,751 A    4/2000 Ichikawa et al.
6,373,127 B1 * 4/2002 Baudouin et al. ........... 257/676

FOREIGN PATENT DOCUMENTS

| JP | 2-216862 | 8/1990 |
| JP | 5-198742 | 8/1993 |
| JP | 7-106521 | 4/1995 |
| JP | 8-102525 | 4/1996 |
| JP | 9-205357 | 8/1997 |
| JP | 10-150148 | 6/1998 |
| JP | 10-326868 | 12/1998 |
| JP | 11-177025 | 7/1999 |

* cited by examiner

Primary Examiner—Brian Sircus
Assistant Examiner—Robert DeBeradinis
(74) Attorney, Agent, or Firm—Posz & Bethards, PLC

(57) ABSTRACT

A plurality of bypass capacitors are associated with a plurality of circuit blocks involved in a microcomputer. Each bypass capacitor is disposed between a power input terminal of a corresponding circuit block and a ground line. The circuit blocks are arrayed with respect to a power supply terminal in order of the noise level at the power input terminals of respective circuit blocks, so that a circuit block having a lower noise level is located near the power supply terminal while a circuit block having a higher noise level is located far from the power supply terminal.

6 Claims, 2 Drawing Sheets

SEMICONDUCTOR INTEGRATED CIRCUIT DEVICE AND METHOD FOR MOUNTING CIRCUIT BLOCKS IN SEMICONDUCTOR INTEGRATED CIRCUIT DEVICE

BACKGROUND OF THE INVENTION

The present invention relates to a semiconductor integrated circuit device comprising a semiconductor substrate and a plurality of circuit blocks each being provided on this substrate and having a power input terminal for receiving electric power supplied from a power supply terminal. Furthermore, the present invention relates to a method for mounting circuit blocks in this semiconductor integrated circuit device.

A one-chip microcomputer serving as a semiconductor integrated circuit device comprises a plurality of circuit blocks, such as CPU, ROM, RAM, and A/D converters. For example, CPU (i.e., central processing unit) comprises numerous transistors each repeating a switching operation in response to a clock signal. Accordingly, CPU is subjected to an increased amount of feedthrough current.

Furthermore, ROM (i.e., read only memory) and RAM (i.e., random access memory) comprise large-scale transistors serving as decoder buffers which also repeat the switching operation. Accordingly, ROM and RAM are subjected to an increased amount of feedthrough current.

The feedthrough current, caused in this manner in response to clock signals, induces fluctuation of electrical potential, referred to as "bounce", at a power supply terminal or at a ground terminal. The produced bounce becomes a power noise which is propagated or transmitted to an external device via a power supply terminal of a microcomputer. As a result, a printed pattern of power supply wiring on a printed circuit board generates undesirable radiative noises resulting from the power noise of the microcomputer.

As the feedthrough current is pulsative, undesirable radiative noises spread in a wide frequency range. For example, on a printed circuit board, the radiative noises are widely produced in a frequency range from several 10 MHz to several 100 MHz. To eliminate such noises caused from a printed circuit board, a conventionally known method is to provide an external bypass capacitor connected to a power source terminal of a microcomputer. However, due to the parasitic inductance inherent to individual capacitors, the impedance of the bypass capacitor becomes large when the generated noise has a higher frequency. Thus, simply relying on an external bypass capacitor connected to the power source terminal of a microcomputer is not effective to suppress high-frequency noises.

SUMMARY OF THE INVENTION

In view of the foregoing problems of the prior art, the present invention has an object to provide a semiconductor integrated circuit device capable of suppressing power source noises in a wide frequency range, especially in higher frequencies. Furthermore, the present invention has an object to provide a method for mounting circuit blocks in this semiconductor integrated circuit device.

To accomplish the above and other related objects, the present invention provides a first semiconductor integrated circuit device comprising a semiconductor substrate mounting a plurality of circuit blocks to which electric power is supplied from a power supply terminal. Each of the plurality of circuit blocks has a power input terminal and a ground terminal. A plurality of bypass capacitors are provided for the plurality of circuit blocks, each bypass capacitor being disposed between the power input terminal and the ground terminal of a corresponding circuit block. According to the first semiconductor integrated circuit device, the order of the plurality of circuit blocks arrayed with respect to the power supply terminal is dependent on the noise level at power input terminals of respective circuit blocks, so that a circuit block having a lower noise level is located near the power supply terminal while a circuit block having a higher noise level is located far from the power supply terminal.

For example, when a microcomputer serves as a semiconductor integrated circuit device mounted on a printed circuit board. Like a conventional technique, adding an external bypass capacitor to the power supply terminal of a microcomputer makes it possible to reduce the power noise propagating along a power wiring pattern on the printed circuit board when such noise is generated in response to an operation of the microcomputer.

However, an actual equivalent circuit of the external bypass capacitor attached to a microcomputer includes not only a capacitance component but also an inductance component as well as a resistance component. Among these components, the inductance component becomes dominant in a high-frequency region and increases the impedance. As a result, relying only the external bypass capacitor is not effective to sufficiently absorb the power noise of the microcomputer.

Hence, according to the present invention, internal bypass capacitors are provided in a semiconductor integrated circuit in such a manner that an independent bypass capacitor is interposed between a power input terminal and a ground terminal of each circuit block in the semiconductor integrated circuit. This is effective to reduce the inductance component so that the increase of impedance can be effectively suppressed in the high-frequency region. As a result, the power noise can be sufficiently absorbed in respective circuit blocks. Furthermore, as the capacitance of each bypass capacitor can be optimized according to the operating condition of each circuit block, absorption of the power noise can be effectively performed.

Furthermore, according to the present invention, a plurality of circuit blocks are arrayed with respect to the power supply terminal in order of the noise level at the individual power input terminals, so that a circuit block having a lower noise level is located near the power supply terminal while a circuit block having a higher noise level is located far from the power supply terminal. According to this layout, the circuit block having the highest noise level has a largest wiring impedance when observed or measured from the power supply terminal.

For example, when LC represents an inductance component of a bypass capacitor interposed between a power input terminal and a ground terminal of a circuit block and LP represents an inductance of a wiring impedance existing between two power input terminals of two circuit blocks, the relationship LP>>LC is established. This makes it possible to allow the generated noise, when generated at a power input terminal, to circulate via a circulation path including the bypass capacitor and attenuate in this circuit block. As a result, propagation of the noise to a neighboring circuit block or to the power supply terminal of the semiconductor integrated circuit can be effectively prevented.

In the circuit block located furthest from the power supply terminal of the semiconductor integrated circuit, the wiring impedance may not be sufficient to obstruct the power noise and accordingly part of the power noise may propagate into a neighboring circuit block. However, in this case, the propagated power noise can be obstructed by a wiring impedance of the neighboring circuit block. The power noise circulates in a circulation path including a bypass capacitor and attenuates in this neighboring circuit block. Thus, further propagation of the noise to the power supply terminal can be surely prevented.

Accordingly, by locating a plurality of circuit blocks in this manner, the circulative attenuation of the power noise brought by the bypass capacitor can be enhanced. The present invention makes it possible to effectively suppress high-frequency components of the power noise and prevent the power noise from propagating via the power supply terminal to the outside of the semiconductor integrated circuit device. Thus, radiative noises of the printed circuit board can be reduced.

Locating the higher noise level circuit block far from the power supply terminal (or the ground terminal) in the semiconductor integrated circuit device makes it possible to reduce an element area of a required bypass capacitor. If this circuit block is located adjacent to the pad of power supply (or ground) terminal, it will be necessary to provide a sufficiently large capacitor area for obstructing the high-frequency noise. Namely, the impedance of a bypass capacitor must be reduced in accordance with the reduction of wiring impedance. Providing a large capacitor area will result in the increase of a chip area and accordingly the downsizing of a semiconductor integrated circuit device will not be realized.

Furthermore, the present invention provides a second semiconductor integrated circuit device which differs from the first semiconductor integrated circuit in that the order of a plurality of circuit blocks arrayed with respect to the power supply terminal is dependent on the number of switching elements provided in respective circuit blocks, so that a circuit block having a smaller number of switching elements is located near the power supply terminal while a circuit block having a larger number of switching elements is located far from the power supply terminal.

The second semiconductor integrated circuit has the same functions and brings the same effects as those of the first semiconductor integrated circuit.

Furthermore, the present invention provides a third semiconductor integrated circuit device which differs from the first semiconductor integrated circuit in that the order of a plurality of circuit blocks arrayed with respect to the power supply terminal is dependent on the frequency of access to respective circuit blocks, so that a circuit block having a smaller frequency of access is located near the power supply terminal while a circuit block having a larger frequency of access is located far from the power supply terminal.

The third semiconductor integrated circuit has the same functions and brings the same effects as those of the first semiconductor integrated circuit.

Moreover, the present invention provides a first method for mounting a plurality of circuit blocks on a semiconductor substrate, each of the circuit blocks having an individual power input terminal which receives electric power supplied from a power supply terminal, and the plurality of circuit blocks being associated with a plurality of bypass capacitors, each bypass capacitor being disposed between the power input terminal and a ground terminal of a corresponding circuit block. The first mounting method comprises a step of arraying the plurality of circuit blocks with respect to the power supply terminal in order of the noise level at the individual power input terminal, so that a circuit block having a lower noise level is located near the power supply terminal while a circuit block having a higher noise level is located far from the power supply terminal.

Furthermore, the present invention provides a second mounting method which differs from the first mounting method in that a plurality of circuit blocks are arrayed with respect to the power supply terminal in order of the number of switching elements provided in respective circuit blocks, so that a circuit block having a smaller number of switching elements is located near the power supply terminal while a circuit block having a larger number of switching elements is located far from the power supply terminal.

Furthermore, the present invention provides a third mounting method which differs from the first mounting method in that a plurality of circuit blocks are arrayed with respect to the power supply terminal in order of the frequency of access to respective circuit blocks, so that a circuit block having a smaller frequency of access is located near the power supply terminal while a circuit block having a larger frequency of access is located far from the power supply terminal.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF PREFERRED EMBODIMENTS

Preferred embodiments of the present invention will be explained hereinafter with reference to attached drawings.

First Embodiment

Figure 1:
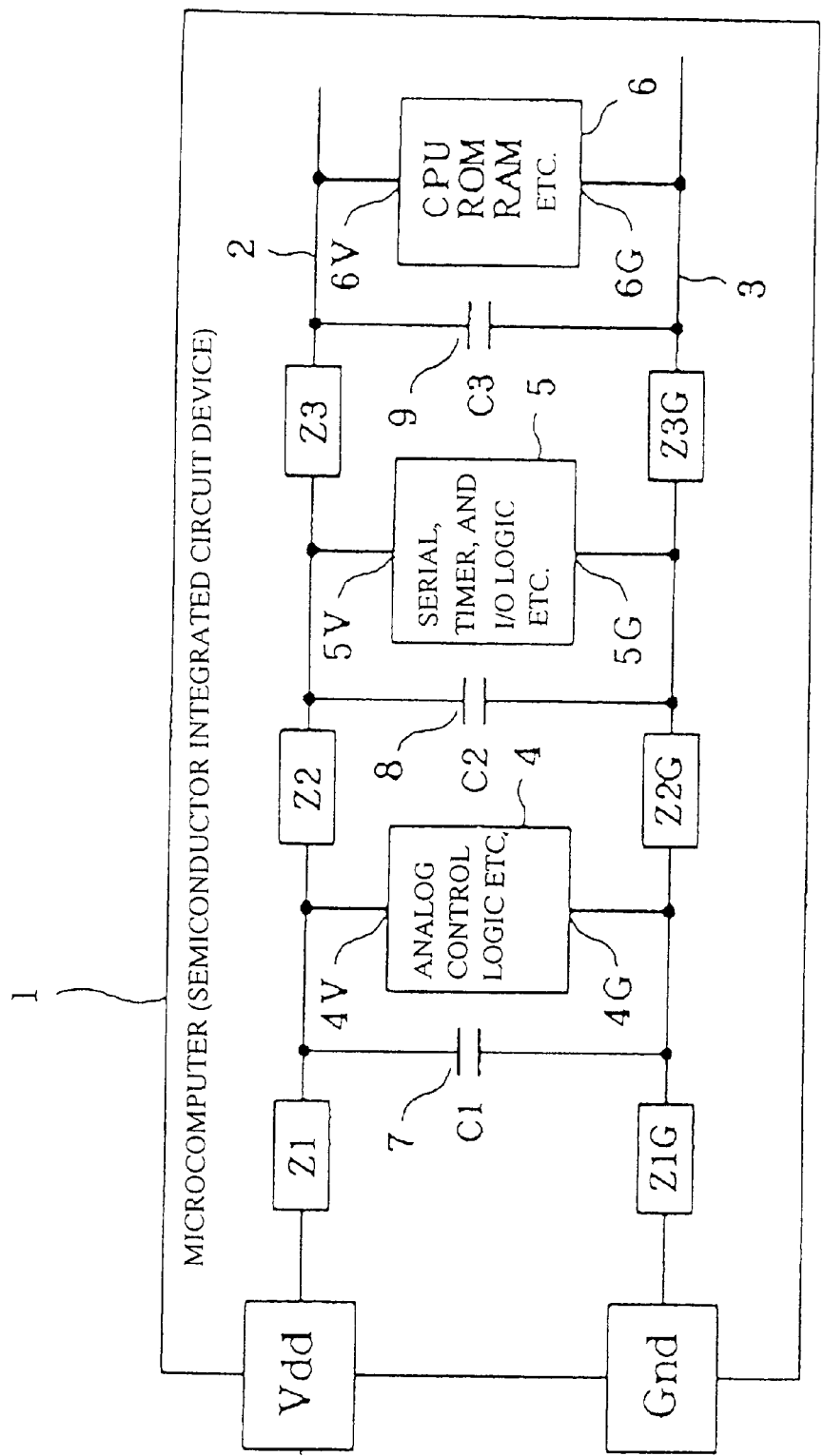
FIG. 1 is a circuit diagram showing a schematic arrangement of a plurality of circuit blocks incorporated in a microcomputer in accordance with a preferred embodiment of the present invention.

In FIG. 1, a microcomputer 1 comprises a power supply terminal Vdd and a ground terminal Gnd which serve as external terminals of microcomputer 1. A power supply line 2, connected to the power supply terminal Vdd, extends in microcomputer 1. Similarly, a ground line 3 connected to the ground terminal Gnd extends in microcomputer 1.

The microcomputer 1 comprises a total of three, i.e., first to third, circuit blocks 4, 5, and 6. Each of first to third circuit blocks 4, 5, and 6 is interposed between the power supply line 2 and the ground line 3. The first circuit block 4 is located adjacent to the power supply terminal Vdd and the ground terminal Gnd. The third circuit block 6 is located farthest from the power supply terminal Vdd and the ground terminal Gnd.

Each of circuit blocks 4 to 6 are functional blocks each being an independent semiconductor circuit constituted depending on required functions. The first circuit block 4 works chiefly as an analog control logic circuit. The second circuit block 5 is a multi-functional block comprising a serial communication device, a timer, and an I/O control logic circuit. The third circuit block 6 includes CPU, ROM and RAM.

The microcomputer 1 comprises a total of three, i.e., first to third, bypass capacitors 7 to 9. The first bypass capacitor 7 is disposed near the first circuit block 4 with one end directly connected to a power input terminal 4V of first circuit block 4 with the other end directly connected to a ground terminal 4G of first circuit block 4.

The second bypass capacitor 8 is disposed near the second circuit block 5 with one end directly connected to a power input terminal 5V of second circuit block 5 with the other end directly connected to a ground terminal 5G of second circuit block 5.

The third bypass capacitor 9 is disposed near the third circuit block 6 with one end directly connected to a power input terminal 6V of third circuit block 6 with the other end directly connected to a ground terminal 6G of third circuit block 6.

The power supply line 2 has an impedance Z1 at a first region ranging from the power supply terminal Vdd to the power input terminal 4V of first circuit block 4, an impedance Z2 at a second region ranging from the power input terminal 4V of first circuit block 4 to the power input terminal 5V of second circuit block 5, and an impedance Z3 at a third region ranging from the power input terminal 5V of second circuit block 4 to the power input terminal 6V of third circuit block 6.

The ground line 3 has an impedance Z1G at a first region ranging from the ground terminal Gnd to the ground terminal 4G of first circuit block 4, an impedance Z2G at a second region ranging from the ground terminal 4G of first circuit block 4 to the ground terminal 5G of second circuit block 5, and an impedance Z3G at a third region ranging from the ground terminal 5G of second circuit block 5 to the ground terminal 6G of third circuit block 6.

Although not shown in the drawing, the power supply line 2 and the ground line 3 are made of aluminum or the like, and the bypass capacitors 7 to 9 are respectively formed by interposing an oxide film between polysilicon electrodes.

Next, functions of this embodiment will be explained with reference to FIG. 2. The layout of first to third circuit blocks 4 to 6 shown in FIG. 1 is dependent on the power noise level estimated through a simulation (or actually monitored) at power input terminals 4V to 6V of respective circuit blocks 4 to 6.

The first circuit block 4 has a relatively low operation speed or a relatively low frequency of operation as it is chiefly constituted by the analog control logic circuit. Thus, the first circuit block 4 is believed to have the lowest power noise level among the three circuit blocks 4 to 6. Accordingly, among a plurality of circuit blocks 4 to 6, the first circuit block 4 is located closest to the power supply terminal Vdd.

On the other hand, the third circuit block 6 has a relatively high operation speed or a relatively high frequency of operation as it comprises CPU, ROM and RAM. Thus, the third circuit block 6 is believed to have the highest power noise level among the three circuit blocks 4 to 6. Accordingly, among the circuit blocks 4 to 6, the third circuit block 6 is located farthest from the power supply terminal Vdd.

The second circuit block 5 has a mid operation speed or a mid frequency of operation as it comprises the serial communication device, the timer, and I/O control logic circuit. Thus, the second circuit block 5 is believed to have an intermediate power noise level among the three circuit blocks 4 to 6, and therefore is located between the first circuit block 4 and the third circuit block 6.

Figure 2:
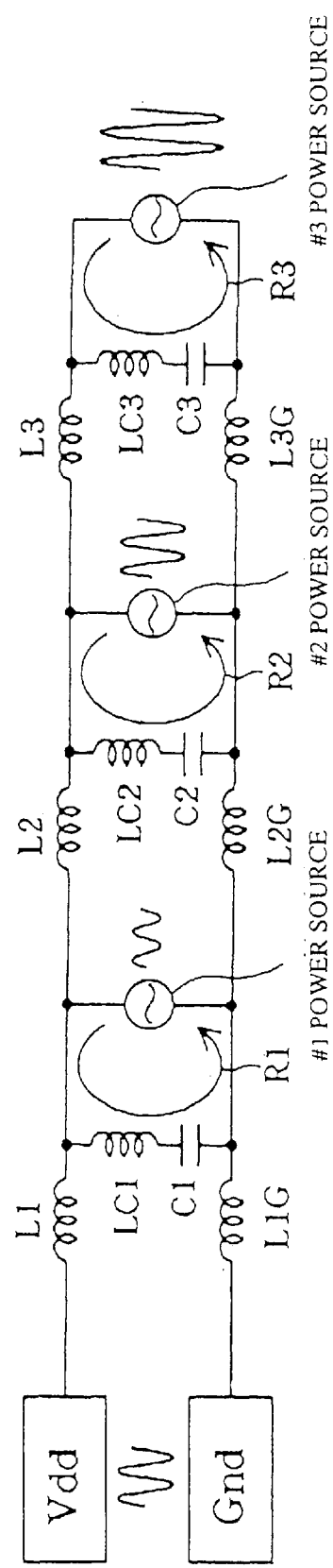
FIG. 2 is an equivalent circuit chiefly illustrating a power supply system of the circuit arrangement shown in FIG. 1.

FIG. 2 is an equivalent circuit chiefly illustrating a power supply system of the circuit arrangement shown in FIG. 1.

In FIG. 2, #1 to #3 power sources represent power noises monitored at the power input terminals 4V to 6V, respectively. Inductances L1–L3 and L1G–L3G represent inductance components contained in the impedances Z1–Z3 and Z1G–Z3G, respectively. Furthermore, LC1 to LC3 represent inductance components contained in bypass capacitors 7 to 9.

According to the layout that the third circuit block 6 having the highest power noise level is located furthest from the power supply terminal Vdd, a total of three inductances L1 to L3 are interposed in series between the power supply terminal Vdd and the power input terminal 6V of the third circuit block 6. Thus, this layout gives the third circuit block 6 a large high-frequency impedance when observed or measured from the power input terminal 6V.

In view of the condition L3>>LC3, the inductance L3 obstructs the power noise generated from the third circuit block 6 which is represented by a voltage of #3 power source. The power noise circulates along a circulation path R3 including the bypass capacitor 9 (C3) and attenuates in the third circuit block 6.

In spite of presence of inductance L3, some of the power noise may propagate to the next circuit block, i.e., to the second circuit block 5. However, in the second circuit block 5, the inductance L2 obstructs the propagated power noise. Thus, the propagated power noise circulates along a circulation path R2 including the bypass capacitor 8 (C2) and attenuates in the second circuit block 5. As a result, further propagation of the power noise to the power supply terminal Vdd is surely restricted.

The first circuit block 4 is located nearest to the power supply terminal Vdd since its noise level, i.e., a voltage of #1 power source, is lowest among three circuit blocks 4 to 6. The power noise generated from the first circuit block 4 is so small that it can be completely obstructed by the inductance L1. The power noise circulates along a circulation path R1 including the bypass capacitor (C1) and attenuates in the first circuit block 4.

Similarly, L1G to L3G obstruct ground noises generated at ground terminals 4G to 6G of the first to third circuit blocks 4 to 6. Thus, propagation of ground noise to the ground terminal Gnd is substantially restricted.

As described above, according to the first embodiment of the present invention, independent bypass capacitors 7 to 9 are interposed between the power input terminal and the ground terminal of corresponding circuit blocks 4 to 6 in the microcomputer 1. Accordingly, it becomes effective to reduce the inductance components of bypass capacitors 7 to 9 so that the increase of impedance can be suppressed in the high-frequency region. As a result, the power noise can be sufficiently absorbed. Furthermore, as the capacitances of respective bypass capacitors 7 to 9 can be optimized according to the operating conditions of respective circuit blocks 4 to 6, absorption of the power noise can be effectively performed.

Furthermore, according to the first embodiment, the first to third circuit blocks 4 to 6 are arrayed with respect to the power supply terminal Vdd considering the noise level at individual power input terminals 4V to 6V of respective circuit blocks 4 to 6, so that the first circuit block 4 having the lowest noise level is located nearest to the power supply terminal Vdd while the third circuit block 6 having the highest noise level is located furthest from the power supply terminal Vdd.

If a high-level power noise is generated from the third circuit block 6, the power noise may not be completely absorbed by the circulation path R3. In such a case, some of the power noise will propagate into the second circuit block 5. However, the inductance L2 surely obstructs the propagated power noise. All of the propagated power noise is absorbed in the second circuit block 5.

Accordingly, the circulative attenuation of the power noise brought by respective bypass capacitors 7 to 9 can be enhanced. Thus, the first embodiment makes it possible to effectively prevent the power noise generated from microcomputer 1 from propagating to the outside via the power supply terminal Vdd. High-frequency noises can be effectively suppressed. Undesirable radiative noises can be removed from a printed circuit board on which the microcomputer 1 is mounted.

Furthermore, according to the first embodiment, the bypass capacitors 7 to 9 comprise polysilicon electrodes which differ from the aluminum members constituting the power supply line 2 and the ground line 3. This effectively prevents the capacitances of the bypass capacitors 7 to 9 from being dispersed like a distributed parameter system, and makes it possible to dispose the bypass capacitors like a concentrated parameter system. Accordingly, attenuation of the power noise by bypass capacitors 7 to 9 can be enhanced.

Second Embodiment

A second embodiment is substantially identical with the first embodiment except that the grouping of circuit blocks is differentiated.

Instead of using the noise level, the second embodiment adopts the number of switching elements, such as metal oxide semiconductor (MOS) transistors, involved in respective circuit blocks as a criteria for determining the grouping of circuit blocks.

According to the second embodiment, the first circuit block 4 shown in FIG. 1 is a circuit block having the smallest number of switching elements while the third circuit block 6 is a circuit block having the largest number of switching elements. The second circuit block 5 is a circuit block having an intermediate number of switching elements.

The rest of the second embodiment is the same as that of the first embodiment.

Third Embodiment

A third embodiment is substantially identical with the first embodiment except that the grouping of circuit blocks is differentiated.

Instead of using the noise level, the third embodiment adopts the frequency of access to respective circuit blocks as a criteria for determining the grouping of circuit blocks.

According to the third embodiment, the first circuit block 4 shown in FIG. 1 is a circuit block having the smallest frequency of access while the third circuit block 6 is a circuit block having the largest frequency of access. The second circuit block 5 is a circuit block having an intermediate frequency of access.

The rest of the third embodiment is the same as that of the first embodiment.

This invention may be embodied in several forms without departing from the spirit of essential characteristics thereof.

The capacitances of bypass capacitors 7 to 9 can be adequately set considering the noise level, the number of switching elements, the frequency of accesses or the like, of respective blocks 4 to 6.

Furthermore, by adequately adjusting the wiring pattern, the impedances Z1 to Z3G of wiring lines 2 and 3 can be set to optimum values considering the noise level, the number of switching elements, the frequency of accesses and the like, of respective blocks.

The number of circuit blocks is not limited to three and therefore can be increased or reduced.

The power supply terminal is not limited to the common one and therefore it is possible to provide one or more additional power supply terminals.

The semiconductor integrated circuit device is not limited to a microcomputer and therefore the present invention is applied to any other integrated circuit device which includes a plurality of circuit blocks mounted on a semiconductor substrate.

The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A semiconductor integrated circuit device comprising a semiconductor substrate mounting a plurality of circuit blocks to which electric power is supplied from a power supply terminal, wherein each of said plurality of circuit blocks has a power input terminal and a ground terminal, a plurality of bypass capacitors are provided for said plurality of circuit blocks, each bypass capacitor being disposed between said power input terminal and said ground terminal of a corresponding circuit block, the order of said plurality of circuit blocks arrayed with respect to said power supply terminal is dependent on the noise level at power input terminals of respective circuit blocks, so that a circuit block having a lower noise level is located near said power supply terminal while a circuit block having a higher noise level is located far from said power supply terminal, and the power input terminals of said plurality of circuit blocks are connected in series so that the power input terminal of said circuit block having the higher noise level is connected to said power supply terminal via the power input terminal of said circuit block having the lower noise level, so as to provide a circulating path constituted by said circuit block having the lower noise level and the associated bypass capacitor for attenuating or absorbing power noise generated not only from the circuit block having the lower noise level but also from the circuit block having the higher noise level.

2. A semiconductor integrated circuit device comprising a semiconductor substrate mounting a plurality of circuit blocks to which electric power is supplied from a power supply terminal, wherein each of said plurality of circuit blocks has a power input terminal and a ground terminal, a plurality of bypass capacitors are provided for said plurality of circuit blocks, each bypass capacitor being disposed between said power input terminal and said ground terminal of a corresponding circuit block, the order of said plurality of circuit blocks arrayed with respect to said power supply terminal is dependent on the number of switching elements provided in respective circuit blocks, so that a circuit block having a smaller number of switching elements is located near said power supply terminal while a circuit block having a larger number of switching elements is located far from said power supply terminal, and the power input terminal of said plurality of circuit blocks are connected in series so that the power input terminal of said circuit block having the larger number of switching elements is connected to said power supply terminal via the power input terminal of said circuit block having the smaller number of switching elements, so as to provide a circulating path constituted by said circuit block having the smaller number of switching elements and the associated bypass capacitor for attenuating or absorbing power noise generated not only from the circuit block having the smaller number of switching elements but also from the circuit block having the larger number of switching elements.

3. A semiconductor integrated circuit device comprising a semiconductor substrate mounting a plurality of circuit blocks to which electric power is supplied from a power supply terminal, wherein each of said plurality of circuit blocks has a power input terminal and a ground terminal, a plurality of bypass capacitors are provided for said plurality of circuit blocks, each bypass capacitor being disposed between said power input terminal and said ground terminal of a corresponding circuit block, the order of said plurality of circuit blocks arrayed with respect to said power supply terminal is dependent on the frequency of access to respective circuit blocks, so that a circuit block having a smaller frequency of access is located near said power supply terminal while a circuit block having a larger frequency of access is located far from said power supply terminal, and the power input terminals of said plurality of circuit blocks are connected in series so that the power input terminal of said circuit block having the larger frequency of access is connected to said power supply terminal via the power input terminal of said circuit block having the smaller frequency of access, so as to provide a circulating path constituted by said circuit block having the smaller frequency of access and the associated bypass capacitor for attenuating or absorbing power noise generated not only from said circuit block having the smaller frequency of access but also from the circuit block having the larger frequency of access.

4. A method for mounting a plurality of circuit blocks on a semiconductor substrate, each of said circuit blocks having an individual power input terminal which receives electric power supplied from a power supply terminal, and said plurality of circuit blocks being associated with a plurality of bypass capacitors, each bypass capacitor being disposed between said power input terminal and a ground terminal of a corresponding circuit block, said mounting method comprising:

arraying said plurality of circuit blocks with respect to said power supply terminal in order of the noise level at said individual power input terminal, so that a circuit block having a lower noise level is located near said power supply terminal while a circuit block having a higher noise level is located far from said power supply terminal, wherein the power input terminals of said plurality of circuit blocks are connected in series so that the power input terminal of said circuit block having the higher noise level is connected to said power supply terminal via the power input terminal of said circuit block having the lower noise level, so as to provide a circulating path constituted by said circuit block having the lower noise level and the associated bypass capacitor for attenuating or absorbing power noise generated not only from said circuit block having the lower noise level but also from the circuit block having the higher noise level.

5. A method for mounting a plurality of circuit blocks on a semiconductor substrate, each of said circuit blocks having an individual power input terminal which receives electric power supplied from a power supply terminal, and said plurality of circuit blocks being associated with a plurality of bypass capacitors, each bypass capacitor being disposed between said power input terminal and a ground terminal of a corresponding circuit block, said mounting method comprising:

arraying said plurality of circuit blocks with respect to said power supply terminal in order of the number of switching elements provided in respective circuit blocks, so that a circuit block having a smaller number of switching elements is located near said power supply terminal while a circuit block having a larger number of switching elements is located far from said power supply terminal, wherein the power input terminals of said plurality of circuit blocks are connected in series so that the power input terminal of said circuit block having the larger number of switching elements is connected to said power supply terminal via the power input terminal of said circuit block having the smaller number of switching elements, so as to provide a circulating path constituted by said circuit block having the smaller number of switching elements and the associated bypass capacitor for attenuating or absorbing power noise generated not only from said circuit block having the smaller number of switching elements but also from the circuit block having the larger number of switching elements.

6. A method for mounting a plurality of circuit blocks on a semiconductor substrate, each of said circuit blocks having an individual power input terminal which receives electric power supplied from a power supply terminal, and said plurality of circuit blocks being associated with a plurality of bypass capacitors, each bypass capacitor being disposed between said power input terminal and a ground terminal of a corresponding circuit block, said mounting method comprising:

arraying said plurality of circuit blocks with respect to said power supply terminal in order of the frequency of access to respective circuit blocks, so that a circuit block having a smaller frequency of access is located near said power supply terminal while a circuit block having a larger frequency of access is located far from said power supply terminal, wherein the power input terminals of said plurality of circuit blocks are connected in series so that the power input terminal of said circuit block having the larger frequency of access is connected to said power supply terminal via the power input terminal of said circuit block having the smaller frequency of access, so as to provide a circulating path constituted by said circuit block having the smaller frequency of access and the associated bypass capacitor for attenuating or absorbing power noise generated not only from said circuit block having the smaller frequency of access but also from the circuit block having the larger frequency of access.

* * * * *